United States Patent [19]

Maher

[11] Patent Number: 4,513,448

[45] Date of Patent: Apr. 23, 1985

[54] LOW POWER RADIO SYNTHESIZER WITH HARMONIC IDENTIFICATION FEATURE

[75] Inventor: Robert A. Maher, Carrollton, Tex.

[73] Assignee: The United States of America as represented by the Secretary of the Army, Washington, D.C.

[21] Appl. No.: 522,949

[22] Filed: Aug. 12, 1983

[51] Int. Cl.³ .......................... H04B 1/16; H03L 7/20
[52] U.S. Cl. .................................. 455/265; 455/260; 331/19; 331/25
[58] Field of Search ...................... 455/260, 264, 265; 375/120; 331/10, 11, 18, 19, 25

[56] References Cited

U.S. PATENT DOCUMENTS

| | | | |
|---|---|---|---|
| 3,676,794 | 7/1972 | Bidell et al. | 331/19 |
| 3,694,766 | 9/1972 | Boelke | 331/19 |
| 3,904,980 | 9/1975 | Hugenholtz | 331/19 |
| 4,001,714 | 1/1977 | Reed | 331/19 |
| 4,272,729 | 6/1981 | Riley, Jr. | 331/11 |

Primary Examiner—Jin F. Ng
Attorney, Agent, or Firm—Anthony T. Lane; Jeremiah G. Murray; Maurice W. Ryan

[57] ABSTRACT

A channelized radio has a phase-lock loop which locks to any one of a plurality of carrier frequencies. These frequencies are harmonics of a reference signal. A harmonic identification circuit is disclosed which produces harmonics of a reference signal which is slightly offset from the original reference signal. The offset harmonic which is closest to the locked frequency is compared with the locked frequency and a difference measurement is produced. This difference measurement identifies the locked frequency and enables the operator to lock to a new frequency if desired.

6 Claims, 2 Drawing Figures

LOW POWER RADIO SYNTHESIZER WITH HARMONIC IDENTIFICATION FEATURE

The Government has rights in this invention pursuant to Contract No. DAAB07-78-C-9052 awarded by the Department of the Army.

BACKGROUND OF THE INVENTION

This invention relates generally to radios and more particularly to a harmonic identification circuit for channelized radios.

By way of example, a packet radio incorporating the harmonic identification feature of this invention will be described, although this feature may be used in other types of channelized radios as well.

Packet radios transmit and receive information which has been encoded in concentrated packets which are transmitted as asynchronus bursts of a modulated high frequency carrier signal. A plurality of these carrier signals are used. In the example described herein, the carrier frequencies cover the range from 1.7984 GHz to 1.9200 GHz in twenty 6.4 MHz steps.

A plurality of such packet radios comprise a network for the interchange of information. The network has continually changing traffic demands which are established, for example, by polling.

Each radio must be capable of being quickly and reliably tuned to any one of the twenty carrier frequencies.

In addition, it is desirable that consumption of power by the radio be minimized as the radios are battery powered units and have a high duty cycle, particularly in the receiving mode.

SUMMARY OF THE INVENTION

A packet radio has carrier frequencies which are harmonics of a reference frequency. A step recovery diode produces (in effect) all the harmonics. A digital to analog converter causes a voltage-controlled oscillator (VCO) to produce a frequency which is one of the carrier frequencies. A phase-lock loop locks in on this frequency. A separate harmonic identification circuit is used to determine which frequency the loop is locked to. If a different frequency is desired from that to which the loop is locked, a microprocessor will cause the voltage supplied to the VCO to be changed.

DESCRIPTION OF THE PREFERRED EMBODIMENT

Figure 1:
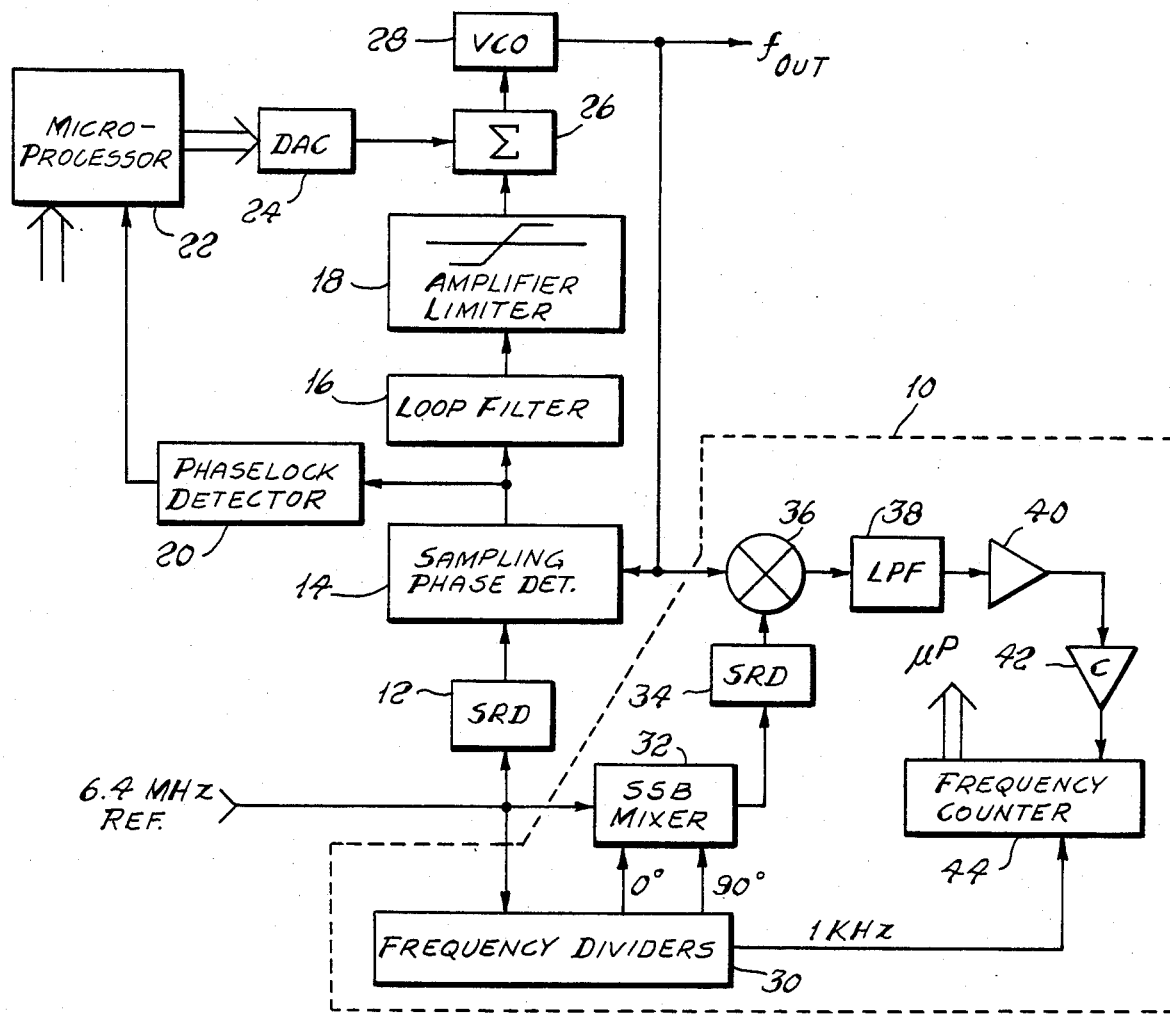
FIG. 1 shows schematically the low power packet radio synthesizer with harmonic identification feature of this invention.

Referring to FIG. 1, the frequency synthesizer of this invention is shown as having two major sections: a harmonic identification circuit 10 (enclosed in the broken line) and the synthesizer main loop.

The synthesizer main loop comprises step-recovery diode (SRD) 12, sampling phase detector 14, loop filter 16, amplifier limiter 18, phaselock detector 20, microprocessor 22, digital to analog converter (DAC) 24, summer 26, and voltage controlled oscillator (VCO) 28. A phase-lock loop is formed by sampling phase detector 14, loop filter 16, amplifier limiter 18, summer 26, voltage controlled oscillator 28 and the feedback line from VCO 28 to sampling phase detector 14.

The harmonic identification circuit 10 comprises: frequency dividers 30, single sideband (SSB) mixer 32, step-recovery diode (SRD) 34, mixer 36, low-pass filter (LPF) 38, amplifier 40, comparator (C) 42, and frequency counter 44.

A reference frequency, in this example chosen as 6.4 MHz, is applied to step-recovery diode 12 of the synthesizer main loop. Step-recovery diode 12, when stimulated by the 6.4 MHz reference, has an extremely rapid state transition rich in harmonics of the reference. (It may be regarded as an impulse generator or a step-generator.) Although a step recovery diode is used in this example, other harmonic generating means may be used.

The harmonics produced by step-recovery diode 12 are fed to sampling phase detector 14. Sampling phase detector 14 also receives $f_{out}$ which is produced by voltage controlled oscillator 28. Sampling phase detector 14 will select the harmonic closest to $f_{out}$ and produce a voltage representative of this harmonic which is applied to loop filter 16. This voltage will pass through amplifier limiter 18 as long as its amplitude does not exceed the limit set.

The output of sampling phase detector 14 is also applied to phaselock detector 20. Phaselock detector 20 signals to microprocessor 22 that a phaselock has been achieved.

An indication is thus received that the phaselock loop is locked to one of the frequencies of the radio, but which frequency is not determined. In accordance with the invention, the harmonic identification circuit 10 provides this information.

The 6.4 MHz reference is applied to single sideband mixer 32 which offsets the reference by a small amount such as 4 KHz and applies it to step recovery diode 34. Step recovery diode 34 generates harmonics of this 6.404 MHz signal and applies them to mixer 36. Mixer 36 also receives $f_{out}$ which is some harmonic $N \times 6.4$ MHz. Mixer 36 produces a frequency which is the difference between $N \times 6.4$ and $N \times 6.404$. The latter frequency being the closest harmonic produced by SRD 34 to $f_{out}$. This difference frequency will then be $N \times 4$ KHz. For N equal to 281 to 300, $N \times 4$ KHz is from 1.124 through 1.200 MHz. Low pass filter 38 will pass frequencies in this range. The difference frequency is applied to amplifier 40 and by it to comparator 42. Frequency counter 44 measures the difference frequency and supplies microprocessor 22 with the result as indicated by the upwardly directed arrow identified by the symbol uP leading the upper left of frequency counter 44 and entering the lower left of microprocessor 22 in FIG. 1 of the drawing.

Since each difference frequency is associated with a particular harmonic, microprocessor 22 can determine if the harmonic presently locked to is the desired one or if it is higher or lower than the frequency desired. If a change is needed, microprocessor 22 will signal digital to analog converter (DAC) 24 to supply a lower or higher voltage, as appropriate, to summer 26. As DAC 24 changes voltage, loop filter 16 will change voltage in the opposite direction so as to keep the loop locked. Amplitude limiter 18 limits the magnitude of the voltage of loop filter which it will pass to summer 26, so eventually the loop will become unlocked. It will then lock on the next harmonic, and continue to unlock and lock until microprocessor 22 determines that the proper frequency has been locked to. After lock is achieved, the microprocessor may reposition the DAC setting slightly to aviod ending up near the edge of the amplitude window.

It is to be noted that power need be supplied to the harmonic identification circuit only until the phase-lock loop has locked on to the desired frequency. Power is thereby conserved.

Figure 2:
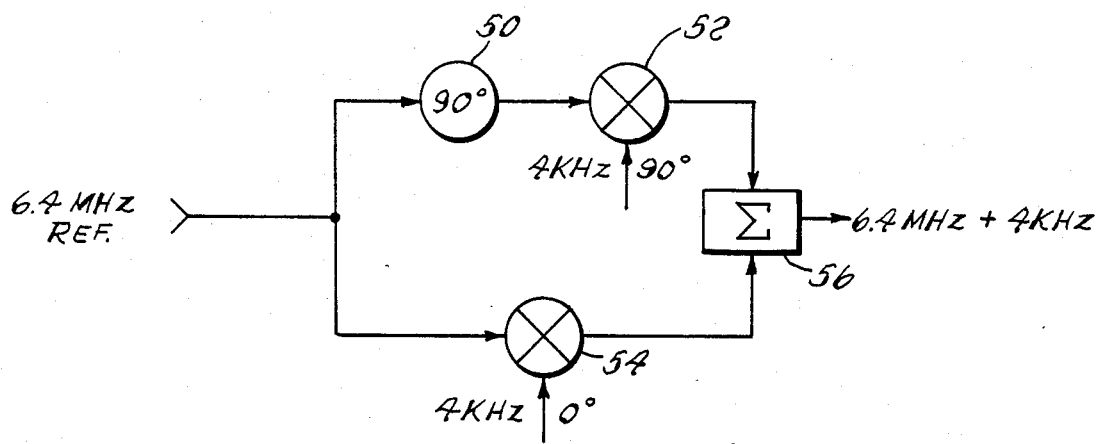
FIG. 2 is a schematic of the single sideband mixer shown as a block in FIG. 1.

Turning now to FIG. 2, single sideband mixer (SSB) 32 will be described. The 6.4 MHz reference is applied to SSB 32 which has two legs. In the upper leg, 90° phase shifter 50 moves the phase of the reference by 90° and applies it to mixer 52. Mixer 52 also receives from frequency dividers 30 (FIG. 1) a 4 KHz signal also 90° out of phase with the original reference. In the lower leg, the 6.4 MHz reference is applied, without shifting, to mixer 54. Mixer 54 also receives from frequency dividers 30 an in-phase 4 KHz signal. Both legs are applied to summer 56 which yields an output frequency of 6.4 MHz plus 4 KHz.

An important point relative to phase jitter in harmonic identification circuit 10 now will be discussed. SSB 32 will, as a practical manner, have phase jitter in its output due to the presence of the unwanted sideband and carrier leakage. It is practical to keep these undesired outputs about 20 dB below the desired output. This level keeps the phase jitter to about ±6° peak to peak [$\sin^{-1} 0.1$]. This phase jitter may be looked at as frequency (phase) modulation of magnitude ±6° and frequency 4 KHz (due to carrier leakage) and frequency 8 KHz (due to unwanted sideband). SRD 34 will magnify this phase jitter by the factor of the harmonic number, 300 maximum. The peak frequency deviation due to the phase disturbance must not exceed the nominal offset frequency, $N \times f_d$ (4 KHz in this example). This condition will assure that the zero-crossings of the phase modulated $N \times f_d$ are unambiguous. Then the average frequency will be exactly $N \times f_d$ in spite of the spurious modulation. By gating the frequency measurement interval to a multiple of the period of $f_d$, the average can be obtained (±1 count) without a long averaging time.

The ratio of the peak frequency deviation can be calculated as follows: let $\Delta\theta$ be the peak phase deviation at the unwanted sideband frequency (removed from the desired sideband by 8 KHz in this case). $\Delta\theta$ is in cycles or portion thereof. The magnitude of the phase deviation after mutiplication by N is $N\Delta\theta$. This phase variation is sinusoidal:

$$\Delta\theta \text{peak} @ \times N = N\Delta\theta \sin 2\pi f_d \times 2$$

$$\Delta\dot{\theta} \text{peak} @ \times N = 4\pi N\Delta\theta f_d \cos 4\pi f_d$$

(The dot indicates time derivative. The time derivative of phase is instantaneous frequency.) (The peak of cos $4\pi f_d$ is 1.)

So the ratio of peak frequency deviation to nominal frequency is:

$$r = 4\pi N\Delta\theta f_d / N f_d = 4\pi\Delta\theta$$

which is independent of N.

For $\Delta\theta = 6°$, $r = 4\pi 6°/360 = 0.21 << 1$, so the zero crossings should be umambiguous, in spite of the unwanted sideband modulation component. The carrier leakage component, $f_d$ removed from the desired sideband, would have half the magnitude of peak frequency deviation for the same amplitude kind of leakage. If the carrier leakage were also 20 dB down, then the value of r could reach (with additive frequency at certain instants) a value of about 0.3, which is still less than 1.

Although a particular embodiment of a low power packet radio with harmonic identification feature has been illustrated and described, it will be obvious that changes and modifications can be made without departing from the spirit of the invention and the scope of the appended claims.

I claim:

1. A channelized radio synthesizer comprising, in combination:
   a. phase-lock loop means for locking to any one of a plurality of carrier frequencies, said phase-lock loop means comprising;
      a voltage controlled oscillator for producing a preselected desired output carrier frequency corresponding to any one of a first plurality of harmonics of a reference signal;
      a summer connected to apply to said voltage controlled oscillator a voltage summed from a first voltage and a second voltage;
      a loop filter for producing said first voltage to be applied to said summer;
      means for producing a first plurality of harmonics of a reference signal;
      a sampling phase detector connected in circuit between the voltage controlled oscillator output and the phase loop filter input for receiving a harmonic of said first plurality of harmonics;
   b. harmonic identification means comprising;
      means for producing a second plurality of harmonics of a second signal offset in frequency slightly from said reference signal;
      a mixer with an input signal combination of the preselected desired output carrier frequency and a harmonic from said second plurality of harmonics, and an output signal corresponding to the difference frequency between said input signal combination;
      counter means for producing a difference measurement signal representative of said difference frequency;
   c. a microprocessor connected to receive said difference measurement signal from said counter means and the output of said sampling phase detector; and
   d. a digital to analog converter having an input connected to the output of the microprocessor for providing said second voltage and connected to apply said second voltage to said summer,
   said second voltage having a magnitude effective to change the output frequency of said voltage controlled oscillator in a direction towards said preselected desired output.

2. A channelized radio synthesizer in accordance with claim 1 wherein:
   said harmonic identification means is operational only until said phase-lock loop means is locked to the preselected desired frequency.

3. A channelized radio synthesizer in accordance with claim 2 wherein said means for producing a first plurality of harmonics comprises:
   a first step-recovery diode.

4. A channelized radio synthesizer in accordance with claim 3 wherein said means for producing a second plurality of harmonics comprises:
   a second step-recovery diode.

5. A channelized radio synthesizer in accordance with claim 1 wherein said means for producing a second plurality of harmonics comprises:
 a first step-recovery diode.

6. A channelized radio synthesizer in accordance with claim 5 wherein said means for producing a second plurality of harmonics comprises:
 a second step-recovery diode.

* * * * *